United States Patent

[11] 3,588,736

[72] Inventor James C. McGroddy
Putnam Valley, N.Y.
[21] Appl. No. 837,832
[22] Filed June 30, 1969
[45] Patented June 28, 1971
[73] Assignee International Business Machines Corporation
Armonk, N.Y.

[54] THREE-TERMINAL BULK NEGATIVE RESISTANCE DEVICE OPERABLE IN OSCILLATORY AND BISTABLE MODES
12 Claims, 6 Drawing Figs.

[52] U.S. Cl. .......... 331/47, 307/272, 307/299, 317/235, 330/5, 331/52, 331/54, 331/107, 331/173
[51] Int. Cl. .......... H03b 7/00, H03k 3/31
[50] Field of Search .......... 331/107 (G), 47, 52, 54, 55, 173; 317/235/10; 307/299, 272; 330/5

[56] References Cited
UNITED STATES PATENTS
3,452,222 6/1969 Shoji .......... 331/107(G)X
FOREIGN PATENTS
1,120,509 7/1968 Great Britain .......... 107(G)331/
1,498,778 9/1967 France .......... 331/107(G)

*Primary Examiner*—Roy Lake
*Assistant Examiner*—Siegfried H. Grimm
*Attorneys*—Hanifin and Jancin and John E. Dougherty, Jr.

ABSTRACT: The negative resistance circuit includes a body of N-type gallium arsenide having an excess carrier concentration ($n_o$) and length ($l$) such that the body exhibits bulk negative differential conductivity but does not inherently produce travelling high field domains. A P-type contact is made between the first region and cathode to form a second region of high resistance. The P contact is selectively biased to cause a high field to shift between the second region and a third region between the first region and anode. The shifting between regions is controlled by the bias to produce either high frequency oscillations or bistability.

INVENTOR
JAMES C. MC GRODDY
BY [signature]

ATTORNEY

THREE-TERMINAL BULK NEGATIVE RESISTANCE DEVICE OPERABLE IN OSCILLATORY AND BISTABLE MODES

BACKGROUND OF THE INVENTION

1. Field of the Invention

This invention relates to devices and circuits which employ bodies of materials that exhibit bulk negative differential conductivity but which do not inherently produce high field travelling domains and inherent high frequency oscillations. More particularly, the invention relates to high frequency oscillator circuits, bistable circuits, and output/amplifier circuits using bodies of this type.

2. Description of the Prior Art

It has been known that many semiconductor materials exhibit bulk negative differential conductivity, and that at least some of these materials can be prepared to inherently produce high frequency oscillations due to travelling high field domains. It is further known that such materials can be prepared to exhibit only bulk negative differential conductivity in which case when a field above threshold is applied, a localized high field is produced near the anode of the device. Further, in applications using the inherent high frequency oscillating materials, the active semiconductor devices employed have been provided with localized regions of high resistance by either doping, a notch in the body, or reverse biased junctions, and the response of the body to produce oscillations have been controlled by light inputs as well as biased PN junctions. Exemplary of the prior art are the following:

a. Article by McCumber and Chynoweth which appeared in the IEEE Transactions on Electron Devices, Vol. E D 13, pp. 4—21, Jan. 1966;
b. Pat. No. 3,435,307, issued to R. W. Landauer on March 25, 1969, and commonly assigned; and
c. Copending application Ser. No. 745,008, filed July 15, 1968, in behalf of J. B. Gunn and commonly assigned.

SUMMARY OF THE INVENTION

In accordance with the principles of the present invention, high frequency oscillator circuits, bistable circuits, amplifier and output circuits, which may, for example, be used in light deflection, are provided using as an active element a body of semiconductor material which exhibits bulk negative differential conductivity but does not inherently produce high frequency oscillations due to travelling high field domains. Typically, the active body is *n*-type gallium arsenide prepared so that the product of the electron carrier concentration ($n_o$) and length ($l$) is less than a critical value of about $10^{12}$ cm$^{12}$. The body of gallium arsenide has a P-type contact made to a first region of the body and a high resistance region formed by a notch between this first region and the cathode contact for the body. In the absence of any bias on the P-type contact, when the threshold field is exceeded, a stable high field is produced in the second high resistance region. By forward biasing the P-type contact to inject holes, the high field region is shifted to a third region near the anode. If only a short bias pulse is applied over and above a normal positive bias on the P-type contact, the high field continuously shifts between the second and third regions. The normally applied positive potential causes hole injection only when the high field is in the third region. When a longer input pulse is applied, the high field remains stably in the third region near the anode. A reverse bias signal then returns the high field to second or high resistance region.

In a further embodiment, the P-type contact is normally unbiased but is coupled through a capacitor to a high frequency Gunn oscillator circuit. The positive spikes produced in the oscillator circuit are coupled through the capacitor with each pulse shifting the high field from the second to third region after which the high field shifts back to the second region before the next positive pulse. The circuit in this application is an output circuit for the high frequency circuit and is usable merely as an output, as an amplifier, or in some applications as a light modulating element.

Therefore, it is an object of the present invention to provide new and improved bulk negative differential conductivity circuits.

It is a further object to provide new and improved high frequency oscillator and bistable circuits.

Another object is to provide improved amplifier and output circuits for high frequency oscillator circuits.

Still another object is to provide circuits of the above type which use as an active element a body of material which exhibits bulk negative differential conductivity but is not required to meet the requirements for the production of inherent bulk oscillations.

These and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
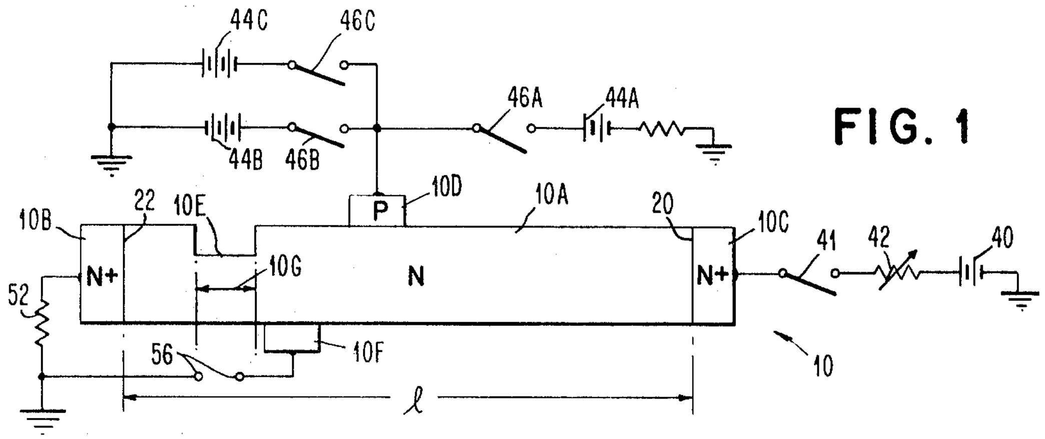
FIG. 1 is a schematic drawing of a circuit illustrating one embodiment of the invention.

In FIG. 1 there is shown, in somewhat schematic form, a solid state bulk negative differential conductivity (BNDC) element, generally designated 10, together with the circuits necessary to operate the element in either a bistable or oscillatory mode. Element 10 is illustratively a body of gallium arsenide having a main portion 10A doped to be slightly N-type, and two ohmic connecting end sections 10B and 10C which are highly N-type. The concentration ($n_o$) of excess majority carriers in portion 10A, here electrons, expressed in carriers per cubic cm, and the length of section 10A ($l$) are controlled so that the $n_o l$ product for the gallium arsenide body is less than necessary for inherent domain nucleation and propagation. At room temperature, this value is typically about $10^{12}$ cm$^{12}$. Therefore, for the element 10 of FIG. 1, the $n_o l$ product is less than $10^{12}$ cm$^{12}$. For such an element, even when an electric field above threshold is applied, though a bulk negative differential conductivity is exhibited, inherent high frequency oscillations due to repetitive domain nucleation, propagation and extinction are not produced.

Element 10 is also provided with a P-type injecting contact 10D, made to a first region of the body, a notch 10E providing a second region of increased resistance, and a ohmic output terminal 10F. Though shown as a local contact the preferred structure is prepared so that the P contact 10D encompasses the entire body at the region at which the contact is made.

Figure 2:
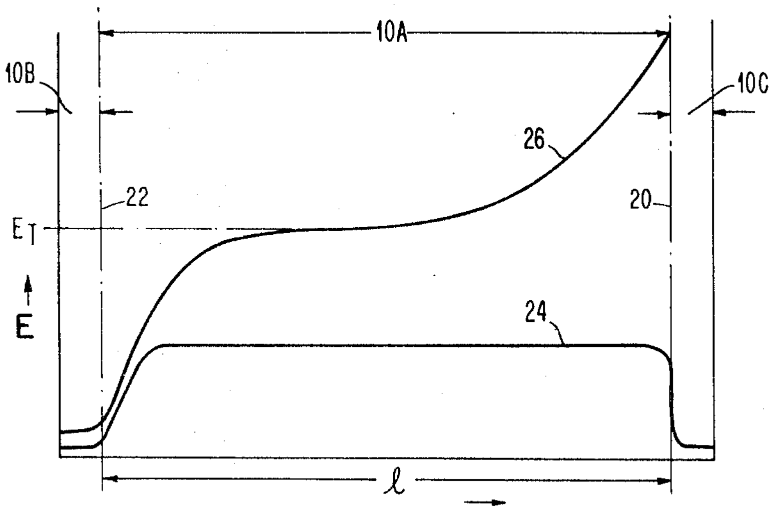
FIG. 2 is a plot of electric field versus length to illustrate the field distribution which would normally occur in an active body of the type used in the embodiment of FIG. 1 without a high resistance region and without hole injection.

However, in order to illustrate the bulk characteristics of the material, these characteristics are plotted in FIG. 2 for a body which is symmetrical throughout in its resistance characteristics between the ohmic connections 10B and 10C (no notch 10E) and which is not influenced by any other connections along its length such as the P-type injection contact 10D.

In the plot of FIG. 2, the electric field (E) is plotted versus the length ($l$) to illustrate the field distribution in such a body when voltages are applied between the ohmic connections which are both above and below the threshold necessary to produce bulk negative differential conductivity.

FIG. 2 is plotted immediately below FIG. 1 to more graphically illustrate the physical relationship of the field distribution to the central or active portion 10A of the element. The length of this portion extends in FIG. 2 between points 20 and 22, with the end portions of the plot depicting the field in the ohmic contacts 10B and 10C. Further, for the plot of FIG. 2, the ohmic contact 10B is the cathode and the ohmic contact 10C is the anode. Curve 24 shows the field distribution when the voltage applied is less than the threshold voltage necessary to cause the threshold field to be exceeded and curve 26 illustrates the field distribution when the applied voltage is above threshold. It is again pointed out that these curves are representative of the basic characteristics of the element 10, in the absence of notch 10E and terminals 10D and 10F.

As shown by curve 24, when the field is below threshold, the field is essentially the same throughout portion 10A and is somewhat lower in the high conductivity ohmic connections 10B and 10C. When, however, the applied voltage causes the threshold field to be exceeded, bulk negative differential conductivity is produced, causing the field distribution to be as shown by curve 26, with a region of localized high field near the anode 10C. The field value $E_T$ indicates generally the threshold field value. As illustrated by curve 26, the field distribution is such that the field is below threshold near the cathode and above threshold in the high field region near the anode. This is the type of field distribution which is known to be produced in the body of semiconductor material which exhibits bulk negative differential conductivity, but in which inherent high frequency oscillations are not produced by repetitive domain nucleation, propagation and extinctions. In certain materials such as gallium arsenide which can be prepared to produce inherent high frequency bulk oscillations (Gunn Effect materials), the characteristic of FIG. 2 is obtained when the $n_o l$ product is less than a critical value. In other materials, a bulk negative differential conductivity is exhibited which is sufficiently weak that inherent bulk oscillations are not easily produced, and the normal characteristics are of the type shown in FIG. 2. For example, in N-type germanium at 77° K. the required $n_o l$ product is about $10^{13}$ $cm^{-2}$.

Figure 3:
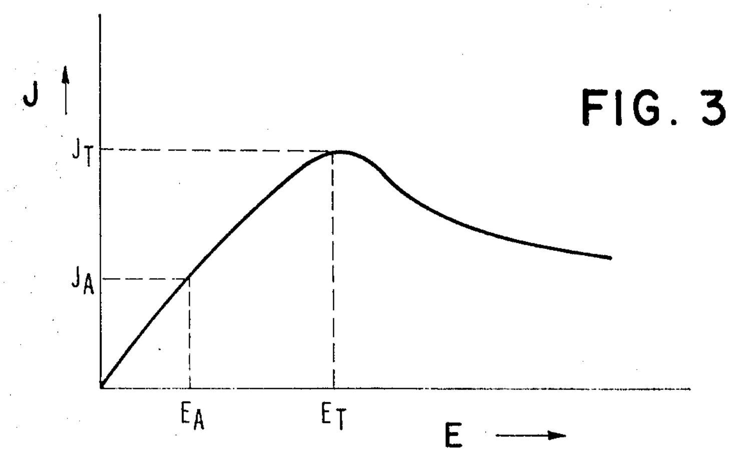
FIG. 3 is a plot of current density versus electric field illustrating the bulk negative differential conductivity characteristics employed in the practice of the invention.

FIG. 3 is a plot indicating the bulk negative differential conductivity characteristic. In this plot, the electric field E is plotted against the current density ($j$) of the majority carriers. As shown, below a threshold field $E_T$, the relationship is first essentially linear and then the current density levels off (saturates). Above the threshold field, the current density ($j$) decreases with increasing field and the bulk negative differential conductivity is exhibited. This is the same characteristic that leads to inherent bulk oscillations (Gunn oscillations). However, in the elements used in the practice of the present invention, the materials are chosen or prepared to exhibit the bulk negative differential conductivity, but not inherent bulk oscillations, and the material characteristics are as exhibited in FIG. 2. Curve 24, in FIG. 2, represents the conditions for a field $E_A$ and current density $j_A$ shown in FIG. 3, and curve 26 in FIG. 2 represents the condition when the threshold field $E_T$ is exceeded by the application of an above threshold voltage. More precisely the threshold current density $j_T$ is exceeded.

Figure 4:
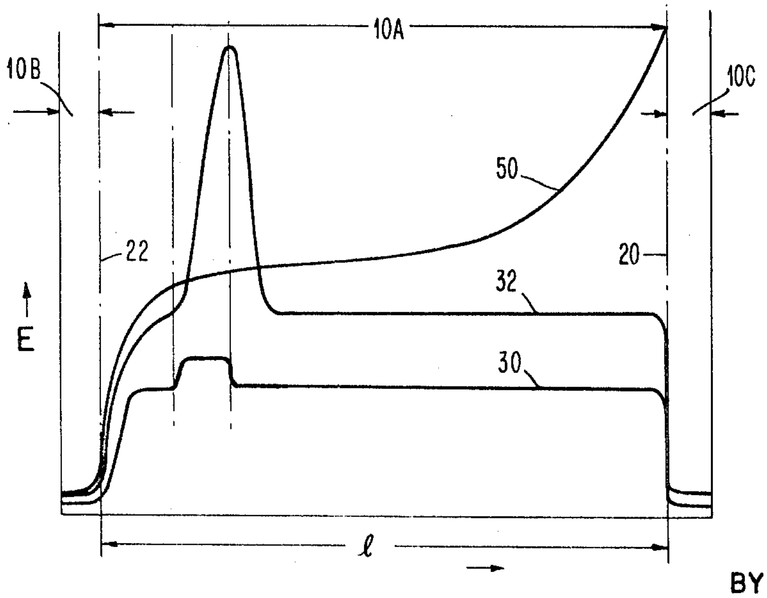
FIG. 4 is a plot similar to that of FIG. 2 which illustrates the field distribution in the active element of the embodiment of FIG. 1 under different operating conditions.

FIG. 4 is a plot illustrating the distribution of the electric field E in the element 10 of FIG. 1, including the notch 10E for different modes of operation under control of signals applied to P contact 10D. This contact forms with the N-type material of portion 10A a PN junction. FIG. 4 is plotted immediately below FIGS. 1 and 2 to more graphically illustrate the field distribution in the actual device and the effects produced by the higher resistance region 10G produced by notch 10E. This region is doped in the same concentration as the rest of portion 10A and the high resistance is the result of decreased cross-sectional area. The same effect can be produced without a change in geometry by lower doping to provide lower concentration of majority carriers in this region, or with a PN junction which is sufficiently reverse biased.

Curve 30 in FIG. 4 represents the field distribution when the voltage applied between ohmic contacts 10B and 10C is less than threshold. The field is essentially homogeneous through portion 10A except for higher field in the higher resistance section 10G. This voltage is applied by a voltage source represented by a battery 40 and variable resistance 42 under control of a switch represented at 41. As above described, the polarity is such that contact 10C is the anode, and contact 10B is the cathode. There are three separate potential applying sources coupled to P contact 10D. Each of these sources includes a source represented by a battery, 44A, 44B, and 44C, which is controllably connected to apply a signal or steady state potential under the control of an appropriate electronic switch, here illustratively represented by mechanical switches 46A, 46B and 46C.

Curve 32 in FIG. 4 illustrates the field distribution when the voltage supplied by battery 40 and resistor 42, is above the amplitude necessary to cause the threshold field to be exceeded in the higher resistance region 10G. As shown, when this threshold is exceeded, due to the bulk negative differential conductivity, there is a very sharp localized increase in the field in this region (10G) and the field in the remainder of the body remains below threshold. If at this time switch 46A is closed to apply the potential of battery 44A to junction between P contact 10D and portion 10A of the element, there is not effect upon the field distribution. This is due to the fact that the potential of battery 44A is so chosen that when the field is distributed as shown by curve 32, the junction between contact 10D and the body is slightly reverse biased. Battery 44A is shown to apply a positive potential. But the potential is less positive than the potential at the region at which the contact 10D is connected to the body when the source 40 applies a voltage to achieve the field distribution shown by curve 32 in FIG. 4. Therefore, the junction is reverse biased, no holes are injected, and the field distribution remains as shown in FIG. 4 by curves 32 with a localized high field in region 10G. The reverse bias then on the junction is very slight to avoid altering the field distribution.

When switch 46A closed, switch 46B is now closed and opened very quickly (using a high speed electronic switch) to momentarily apply the higher positive potential of battery 44B to P contact 10D and cause a number, or sheet, of holes to be injected into the region of the body to which the contact is made. This localized group or sheet of holes with attracted electrons drifts toward the cathode 10B, raising the conductivity of the material as it passes. No significant effect is produced on the field distribution until the moving sheet of carriers reaches the high field region 10G shown by curve 32. When the carriers reach this region, the conductivity is increased so that the current density is below threshold in this region and the voltage distribution across the body is changed so that there is a higher field across the remainder of portion 10A and the current increases in the body to a value above $j_T$. This causes the threshold field to be exceeded in the body and due to the bulk negative differential conductivity, the field distributes to provide a high field region near the anode as shown by curve 50 in FIG. 4.

The device remains with the field distribution of curve 50 until the sheet of holes passes the high resistance region 10G, at which time the resistance of this region returns to a high value and the distribution shifts to that shown by curve 32 with the high field in region 10G. However, when the high field region is shifted to the right (curve 50), the major portion of the voltage drop in portion 10A is across this region, and the region to which P-type contact 10D is connected is less positive than the potential supplied by source 44A. (Battery 44B is not applying a potential since switch 46B is closed only momentarily). As a result, another group of holes is injected, the injection being terminated when the high field is shifted from the anode (curve 50) back to region 46D, at which time the junction at contact 10D is no longer forward biased.

This second group of localized holes produces a sheet of conduction carriers which drifts toward the cathode 10B causing the process to repeat itself. Specifically, the localized high field continuously shifts from region 10G (here termed the second region) to a third region near the anode contact 10C and then back to the second region. Each shift from second to third region causes a momentary forward biasing of the junction at contact 10B, resulting in the injection of a sheet of holes which drift to the high resistivity region and cause the shifting process to continue.

During this shifting process, the voltage across the entire element 10 does not change appreciably, but there is some change in the current at the frequency of the shifting which can be sensed by a load resistor such as that shown at 52. As the localized high field is shifted back and forth the voltage across localized section of the element does change, however, and this voltage is sensed in a high impedance output circuit between a pair of terminals 56 which are connected to the cathode 10B and an ohmic contact 10F which bridge high field region 10G.

Figure 5:
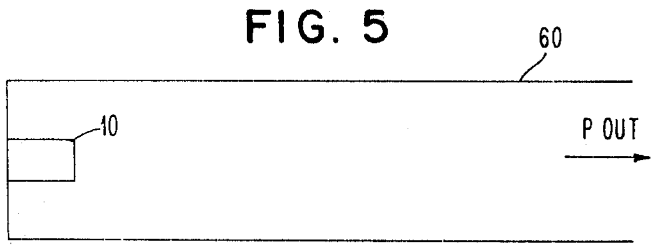
FIG. 5 is a schematic showing of the manner in which the embodiment of FIG. 1 is incorporated in a cavity to obtain high frequency outputs.

When the circuit is operated in a high frequency oscillatory mode as described above, it is preferable to avoid making extra contacts to the device and to take the high frequency output by connecting the device in a wave guide or cavity such as is illustrated in FIG. 5. In this FIG., the device of FIG. 1 with circuitry to produce the oscillations of the high field between different regions is represented at 10 and a cavity in which the device is connected is represented at 60. The coupling to the cavity is effected by the periodic changes in electromagnetic field distribution around the element 10 which are produced by the periodic shifting of the high field.

The oscillation or shifting of the high field region in the device of FIG. 1 may be interrupted by closing switch 46C to apply the negative potential of source 44C to the P-type contact 10D so that the junction between this contact and the body is not forward biased even when the high field is shifted to the region adjacent the anode. As a result, no new sheet of holes is injected and when the high field shifts back to region 10G it remains in this region. The field distribution state is then that represented by curve 32 in FIG. 2. The same result can be obtained by opening switch 46A instead of closing switch 46C. No biasing potential is then applied to the P-type contact, the oscillations are interrupted, and the device returns to the state of curve 32.

Finally, the oscillations can also be interrupted by closing switch 46B to cause holes to be continuously injected at the P contact 10D. As a result, the portion of the device between the contact 10D and the cathode 10B, in effect contains a continuing current of conduction carriers so that region 10E remains in a high conductivity state and the localized high field remains near the anode. The stable state of the device is then represented by the field distribution of curve 50. Once this condition is realized, switch 46B can be opened and contact 10D continues to inject due to the lower positive voltage produced in the region adjacent this contact with the high field adjacent anode 10C.

This latter described mode of operation inherently illustrates the capability of the device to be operated in a bistable mode without oscillations. Switch 46B is closed and held closed for a sufficient time to establish a continuous flow of conduction carriers between contact 10D and cathode 10B to cause the device to assume the state with the high field region near the anode. When the input signal is terminated, the device remains in this state. The device is switched to the other state by operating switch 46C for a time sufficient to interrupt the injection of holes by contact 10D to cause the device to assume a stable state with the high field in region 10G between the contact 10D and cathode 10B. The state of the device is exhibited by the voltage at terminals 56.

Thus, the device of FIG. 1 with the voltage sources and circuits shown is operated in an oscillatory manner to produce a high frequency output, and the oscillations are initiated by a single pulse and terminated by a single pulse to cause the device to assume either one of two stable states with a high field region at different regions in the semiconductor body. The oscillations can also be interrupted by interrupting or lowering the supply voltage applied across the ohmic contacts. The device is also operable in a bistable manner without oscillations in response to pulses of proper polarity applied at contact 10D.

Figure 6:
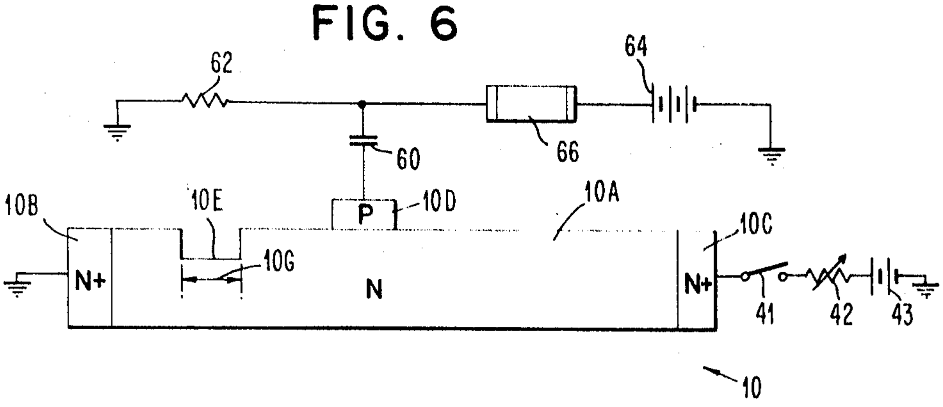
FIG. 6 is a further embodiment of the invention in which the novel bulk negative differential conductivity circuit is driven by a high frequency oscillator circuit.

Another embodiment of the invention is illustrated in FIG. 6 which includes as an active element the same type of element 10 as is shown in FIG. 1. Like components in FIG. 6 are identified using the same reference numerals as are used in FIG. 1. The circuit differs from that of FIG. 1 in the connections to the control or P-type contact 10D. Assuming switch 41 is closed and a voltage above threshold is applied between contacts 10B and 10C, the body is normally in a state with a high field in region 10G. The input or control circuit is connected through a capacitor 60 to contact 10D. This circuit is in the form of a high frequency oscillator which produces high frequency signals across a load 62 in response to an above threshold voltage applied by a source 64 to a bulk or Gunn oscillator 66. During each oscillation a positive going pulse or spike is produced which is transmitted through capacitor 60 to cause hole injection to switch the high field region in device 10 to the region near the anode. In between the positive going spikes, the voltage in the input oscillator circuit is essentially constant so that P contact 10D is unbiased and thus after each positive pulse which switches the high field to the anode in device 10, the high field switches back to region 10G.

This type of circuit is useful in tailoring outputs of a high frequency oscillator to a particular application, and even for amplifications in some cases. In effect, the element 10 serves as an output for the high frequency oscillator circuit which need supply only the positive pulses to contact 10D which need not be high power pulses. In some cases in which it is desired to modulate light with the effects produced by a field in a bulk device, the circuit of FIG. 6 is useful since the device 66 may employ any material which produces high frequency oscillations regardless of its band gap and the material of the element 10 is chosen to match the band gap and absorption requirements for the particular application. The advantage follows from the fact that bulk negative differential conductivity can be achieved in a large number os semiconductor materials with different absorption characteristics and in some of these materials inherent high frequency oscillations using the Gunn Effect cannot be produced at all or with any degree of efficiency.

Though only a limited number of applications of the inventive device have been disclosed, other applications can be readily achieved by changes in the circuitry associated with the active element. For example, the P-type contact can normally be pulsed as in the oscillator circuit described and a feedback connection made from the load circuit to the input circuit for the P contact. This feedback circuit can include a capacitor which is gradually charged by the oscillations so that the oscillations are cut off after a predetermined number of cycles under control of the bias applied to the P region.

While the invention has been particularly shown and described with reference to preferred embodiments thereof, it will be understood by those skilled in the art that the foregoing and other changes in form and details may be made therein without departing from the spirit and scope of the invention.

I claim:

1. A circuit including a bulk negative differential conductivity semiconductor device comprising:

a. a body of semiconductor material of N conductivity-type which in response to an applied electric field above a threshold value exhibits a bulk negative differential conductivity without inherently producing travelling high field domains and bulk oscillations;

b. anode and cathode connections at opposite ends of said body;

c. a P-type contact made to a first region of said body, and a PN junction between said contact and said first region;

d. a second region of said body located between said first region and said cathode connection having a higher resistance than the remainder of the body;

e. means applying a voltage across said anode and cathode connections having an amplitude such that the threshold field is exceeded in said second region but not in the remainder of said body and a localized high field is produced in said second region;

f. and signal means for selectively applying a forward biasing signal to said P contact to cause holes to be injected into said first region and cause carrier propagation from said first region through said second region to said cathode to redistribute the field and cause the high field in said body to be shifted from said second region to a third region between said first region and said anode connection.

2. The circuit of claim 1 wherein said signal means includes means connected to said P-type contact for normally applying a positive potential which is insufficient to forward bias the junction when the high field is in said second region.

3. The circuit of claim 2 wherein said signal means applies a forward biasing signal to said P-type contact to cause holes to be injected into said body which signal is terminated before said holes propagate through said second region, and upon termination of said signal said contact is maintained at a sufficiently positive potential to cause said high field to continuously shift between said second region and said third region.

4. The circuit of claim 2 wherein said signal means applies a forward biasing signal to said P-type contact to shift said high field to said third region and said signal is of sufficient duration that said high field remains in said third region upon termination of the applied signal.

5. The circuit of claim 1 wherein said signal means includes a high frequency oscillator circuit coupled to said P-type contact for applying high frequency forward biasing signals to said P-type contact.

6. The circuit of claim 1 wherein said P contact is normally unbiased and said signal means applies individual forward biasing signals to said P contact.

7. The circuit of claim 1 wherein said body of material is a body of gallium arsenide and the $n_o l$ product for the body is less than the critical value for domain formation and propagation and inherent bulk oscillations in the body.

8. The circuit of claim 1 wherein said second region in said body is a region having a cross-sectional area less than the cross-sectional area of the remainder of said body.

9. A circuit including a bulk negative differential conductivity semiconductor device comprising:

a. a body of semiconductor material of one conductivity type which in response to an applied electric field above a threshold value exhibits a bulk negative differential conductivity without inherently producing travelling high field domains and bulk oscillations;

b. anode and cathode connections at opposite ends of said body;

c. a contact of opposite conductivity type made to a first region of said body, and a PN junction between said contact and said first region;

d. a second region of said body located between said first region and said cathode connection having a higher resistance than the remainder of the body;

e. means applying a voltage across said anode and cathode connections having an amplitude such that the threshold field is exceeded in said second region;

f. and signal means for selectively applying a forward biasing signal to said opposite conductivity contact and to cause minority carriers to be injected into said first region.

10. The circuit of claim 1 wherein said body is N-type and said contact is P-type.

11. A high frequency oscillator circuit comprising:

a. a body of semiconductor material of N conductivity-type which in response to an applied electric field above a threshold value exhibits a bulk negative differential conductivity without inherently producing travelling high field domains and bulk oscillations;

b. anode and cathode connections at opposite ends of said body;

c. a P-type contact made to a first region of said body, and a PN junction between said contact and said first region;

d. a second region of said body located between said first region and said cathode connection having a higher resistance than the remainder of the body;

e. means applying a voltage across said anode and cathode connections having a amplitude such that the threshold field is exceeded in said second region;

f. and signal means for applying a forward biasing potential to said P contact to cause holes to be periodically injected into said first region.

12. A bistable oscillator circuit comprising:

a. a body of semiconductor material of N conductivity-type which in response to an applied electric field above a threshold value exhibits a bulk negative differential conductivity without inherently producing travelling high field domains and bulk oscillations;

b. anode and cathode connections at opposite ends of said body;

c. a P-type contact made to a first region of said body, and a PN junction between said contact and said first region;

d. a second region of said body located between said first region and said cathode connection having a higher resistance than the remainder of the body;

e. means applying a voltage across said anode and cathode connections having an amplitude such that the threshold field is exceeded in said second region;

f. and signal means for selectively applying forward and reverse bias potentials to said P contact.